United States Patent [19]

Ando et al.

[11] Patent Number: 5,362,662
[45] Date of Patent: Nov. 8, 1994

[54] METHOD FOR PRODUCING SEMICONDUCTOR MEMORY DEVICE HAVING A PLANAR CELL STRUCTURE

[75] Inventors: Yuichi Ando, Sanda; Koichi Sogawa, Kobe, both of Japan

[73] Assignee: Ricoh Company, Ltd., Tokyo, Japan

[21] Appl. No.: 57,188

[22] Filed: May 3, 1993

Related U.S. Application Data

[63] Continuation-in-part of Ser. No. 800,746, Nov. 29, 1991, abandoned, which is a continuation of Ser. No. 554,665, Jul. 17, 1990, abandoned.

[30] Foreign Application Priority Data

Aug. 11, 1989 [JP] Japan ................... 1-209434

[51] Int. Cl.⁵ .................. H01L 21/70; H01L 27/00
[52] U.S. Cl. .................. 437/52; 437/48; 437/50; 437/192; 437/200
[58] Field of Search .................. 437/47–48, 437/52, 200, 29, 192; 257/390–391

[56] References Cited

U.S. PATENT DOCUMENTS

| | | | |
|---|---|---|---|
| 4,096,522 | 6/1978 | Suzuki et al. | 357/41 |
| 4,200,474 | 4/1980 | Morris | 257/390 |
| 4,342,100 | 7/1982 | Kuo | 257/391 |
| 4,410,904 | 10/1983 | Wolleson | 357/23.12 |
| 4,430,791 | 2/1984 | Dockerty | 357/23.3 |
| 4,477,310 | 10/1984 | Park et al. | 357/41 |
| 4,639,893 | 1/1987 | Eitan . | |
| 4,951,103 | 8/1990 | Esquivel et al. | 357/67 |
| 5,023,682 | 6/1991 | Shimizu et al. | 357/23.6 |

FOREIGN PATENT DOCUMENTS

| | | |
|---|---|---|
| 0109854 | 11/1983 | European Pat. Off. . |
| 139667 | 8/1984 | Japan . |
| 139668 | 8/1984 | Japan . |
| 61-287164 | 12/1986 | Japan . |
| 0288464 | 12/1986 | Japan . |
| 62-678857 | 3/1987 | Japan . |
| 96953 | 4/1988 | Japan . |
| 2019091 | 4/1979 | United Kingdom . |

*Primary Examiner*—Olik Chaudhuri
*Assistant Examiner*—H. Jey Tsai
*Attorney, Agent, or Firm*—Cooper & Dunham

[57] ABSTRACT

A semiconductor memory device includes a substrate, a first diffusion region composed of at least one longitudinal and continuous source region which is disposed on the substrate and commonly used for a plurality of memory transistors, and a second diffusion region composed of at least one longitudinal and continuous drain region which is disposed in parallel with the first diffusion region and commonly used for the plurality of memory transistors. A refractory metal film is disposed on each of the first and second diffusion regions. An electric insulation film is disposed on the refractory metal film. A plurality of parallel gate electrodes are disposed crossing over the first and second diffusion regions. And a gate oxide film is arranged to electrically insulate the gate electrodes from the diffusion regions.

21 Claims, 3 Drawing Sheets

METHOD FOR PRODUCING SEMICONDUCTOR MEMORY DEVICE HAVING A PLANAR CELL STRUCTURE

CROSS-REFERENCE TO RELATED APPLICATION

This is a continuation-in-part of application Ser. No. 07/800,746 filed Nov. 29, 1991, abandoned, which in turn is a continuation of application Ser. No. 07/554,665 filed on Jul. 17, 1990 abandoned.

BACKGROUND OF THE INVENTION

1. Field of the Invention

The present invention relates to a semiconductor memory device and a method for producing the memory device.

2. Description of the Related Art

In general, a MOS type semiconductor integrated circuit device is fabricated in such a way that a field oxide film is formed to isolate the device and that the source region and the drain region are formed by a self-aligning method using a gate electrode as a mask and implanting impurities into the substrate. The source region and the drain region have to be contacted together through one or two contacts for one transistor. This results in a disadvantage that the integration density is lowered depending on the contact margin of the regions and the wiring pitch thereof.

To cope with this problem, a semiconductor integrated circuit device having a planar cell structure is proposed (see Japanese Patent Application Laying Open (KOKAI) Nos .61-288464 and 63-96953).

In accordance with the planar cell structure, a continuous diffusion area as a common source region for a plurality of MOS transistors and a continuous diffusion area as a common drain region for a plurality of MOS transistors are formed on a substrate in parallel to each other. Also, on the substrate are formed gate electrodes which crossover both of the source and drain diffusion areas through an insulation film.

Due to the planar cell structure mentioned above, it becomes unnecessary to provide a field oxide film for device isolation and also it becomes possible to use one common contact for several or more transistors since each of the source diffusion area and the drain diffusion area is commonly used for a plurality of transistors, which makes it possible to achieve a high integration density of the device.

In accordance with a method for producing the planar cell structure memory device, the device is fabricated in such a way that, first, on a substrate are formed a field oxide film, diffusion areas for source and drain of the memory region, a gate oxide film and a gate electrode made from polycrystalline silicon (polysilicon). After that, a resist pattern having openings in a core portion (channel region) of the memory transistor is formed in accordance with the data to be written. After that, ions are implanted to raise the threshold voltage of the transistor so that the transistor is not turned on at a level of the value of the gate voltage for reading the data.

However, the above-mentioned planar cell structure has a disadvantage that the diffusion resistance becomes large since the bit line is elongated in the longitudinal diffusion region, which lowers the functional speed of the transistor.

SUMMARY OF THE INVENTION

It is therefore an object of the present invention to provide a semiconductor memory device having a planar cell structure in which the functional speed thereof is heightened.

Another object of the present invention is to provide a method for producing the high speed semiconductor memory device having the planar cell structure.

The object of the invention can be achieved by a semiconductor memory device comprising: a first diffusion region for source regions of a plurality of memory transistors formed on a substrate; a second diffusion region for drain regions of a plurality of transistors, the second diffusion region being formed in parallel with the first diffusion region on the substrate; a silicide film formed on the first and second diffusion regions; an insulation film formed on the silicide film, the insulation film being thicker than a gate oxide film; and a gate electrode crossing over the first and second diffusion regions and being insulated from the diffusion regions.

Also, the object of the invention mentioned above can be achieved by a method for producing the semiconductor memory device comprising steps of: (A) forming a silicon nitride film on a semiconductor substrate through a buffer oxide film and patterning the silicon nitride film so that the film has openings in a first diffusion region for source regions of a plurality of memory transistors and in a second diffusion area for drain regions of a plurality of memory transistors; (B) implanting impurities into the substrate using the patterned silicon nitride film as a mask; (C) removing the buffer oxide film in the openings of the patterned silicon nitride film and after that depositing a refractory metal film; (D) forming a silicide film by a thermal treatment; (E) removing the unreacted refractory metal film by etching; (F) filling the openings of the pattern of the silicon nitride film with an insulation material other than silicon nitride; (G) removing the silicon nitride film; (H) removing the buffer oxide film; (I) forming a gate oxide film; and (J) depositing a polysilicon film and patterning the film to form gate electrodes.

An advantage of the above mentioned semiconductor memory device of the present invention is that, due to the structure that the silicide film is formed along the longitudinal diffusion region which functions as a bit line, the resistance of the bit line is lowered compared to the structure that only the diffusion region is formed without the silicide film.

Another advantage of the memory device of the present invention is that the capacity between the bit line and the word line (gate electrode) can be reduced due to the arrangement of the insulation film which is thicker than the gate oxide film and disposed between the bit line and the word line which crossovers the bit line.

Still another advantage of the memory device of the present invention is that it becomes possble to avoid increasing the junction capacitance of the bit line due to the arrangement of the thick insulation film disposed between the bit line and the word line so that the core ions are prevented from being implanted into the bit line at the time of ion implantation process.

Therefore, it becomes possible to achieve a high speed function of the memory device.

Further objects and advantages of the present invention will be apparent from the following description of the preferred embodimemts of the invention as illustrated in the accompanying drawings.

BRIEF DESCRIPTION OF THE DRAWINGS

FIG. 1b is a sectional view of the memory device of FIG. 1a taken along the line B-B' of FIG. 1a;

FIG. 1c is a sectional view of the memory device of FIG. 1a taken along the line C-C' of FIG. 1a.

DESCRIPTION OF THE PREFERRED EMBODIMENTS

Figure 1A:
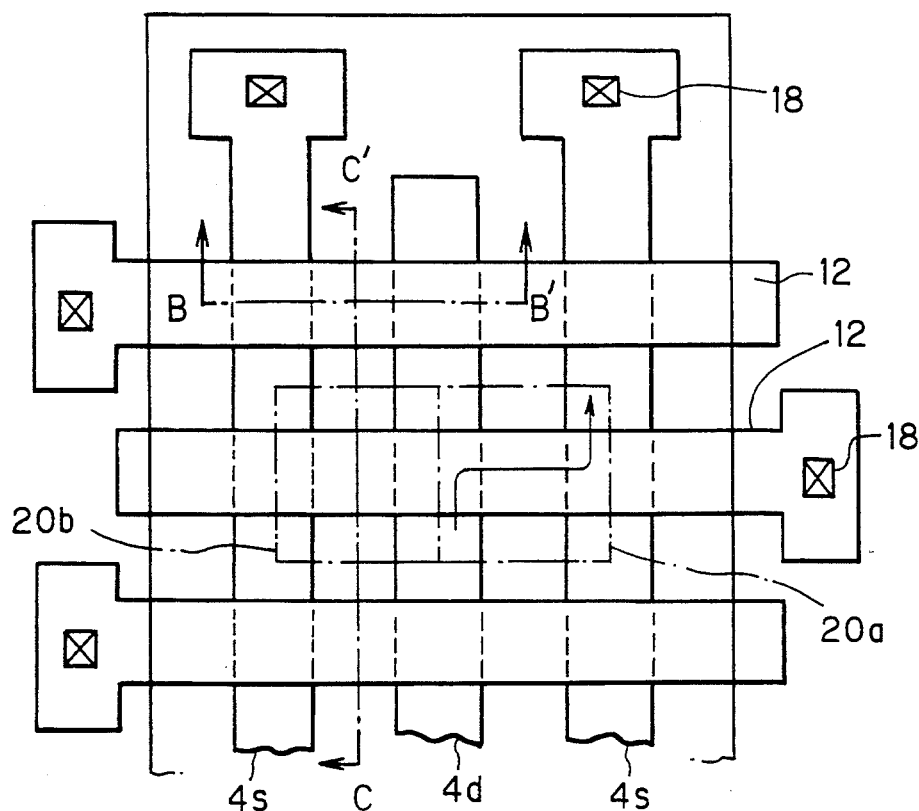
FIG. 1a is a plan view of a memory device in accordance with an embodiment of the present invention.
Figure 1B:
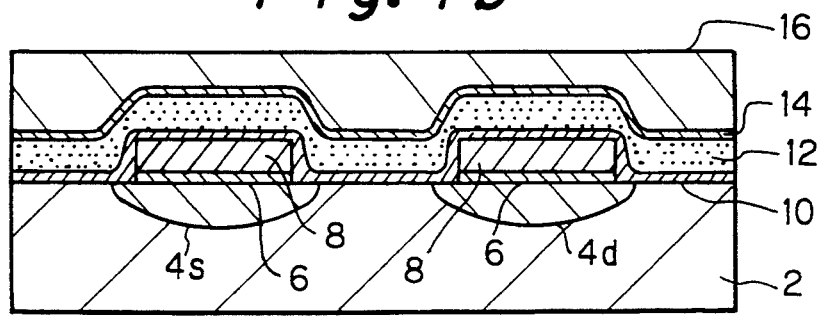
Figure 1C:
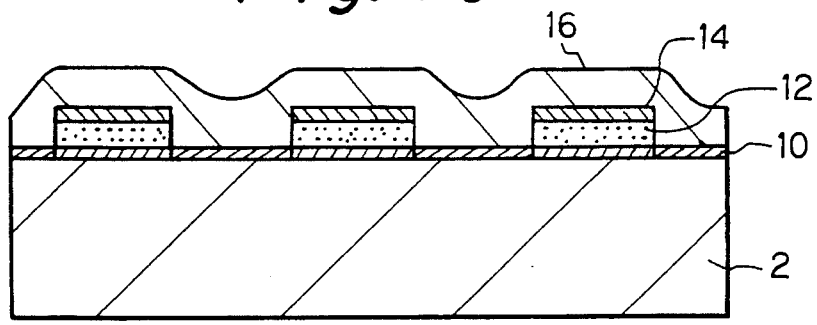

FIGS. 1a to 1c illustrate an embodiment of the present invention. FIG. 1a is a plan view. FIGS. 1b and 1c are sectional views of the device taken along the lines B-B' and C-C' of FIG. 1a, respectively. Note that the scales of the drawings are not strictly the same.

Numeral 2 designates a P-type silicon substrate. In the illustration of FIG. 1a, two source regions 4s and a drain region 4d are formed on the substrate 2. Each region is formed in a form of continuous strip. The regions are in parallel to each other. The regions 4s and 4d are made by $N^{30}$ diffusion regions commonly used for a plurality of memory transistors. A refractory metal silicide film 6 is formed on each of the diffusion regions 4s and 4d. On the silicide film 6 is formed a thick oxide film 8 made from PSG (Phospho-Silicate Glass), for example. The surface of the substrate 2 in the portion uncovered by the silicide film 6 is covered by a gate oxide film 10 instead.

Gate electrodes (word lines) 12 made of polysilicon are formed on the substrate 2 through the gate oxide film 10 or the thick oxide film 8 in the direction perpendicular to the longitudinal direction of the diffusion regions 4s and 4d. On each of the word lines 12 is formed a refractory metal silicide film 14. Numeral 16 designates an insulation film to cover the layered structure.

The diffusion regions 4s and 4d are alternately arranged in the order of the source region 4s, the drain region 4d, the source region 4s . . . . . . . The numeral 18 designates a contact.

In FIG. 1a, each of the regions 20a and 20b defined by dash lines represents one memory transistor. The ROM code of each transistor is determined from the threshold voltage which depends on whether the core ions are implanted into its channel region in the substrate or not. In this particular embodiment, it is assumed that the core ions are not implanted into the channel region of the transistor 20a while the ions are implanted into the channel region of the transistor 20b. Under this assumption, when the word line 12 of the transistor 20a is selected and supplied with voltage, current flows from the bit line (drain diffusion region 4d) to the source region 4s. On the other hand, when the word line 12 of the transitor 20b is selected and supplied with voltage, current does not flow from the bit line 4d to the source region 4s . Due to such a functional arrangement, it becomes possible to read the ROM code of the transistor by a sensor circuit connected to the bit line 4s.

FIGS. 2a to 2h illustrate sectional views of the memory device in sequence in different steps of a method for producing the memory device in accordance with one embodiment of the present invention.

Figure 2A:
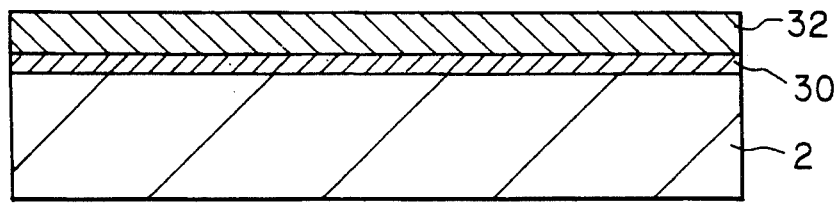
FIGS. 2a to 2h are explanatory views for explaining an embodiment of the method for producing the memory device of the present invention and representing the sections of the device in series in the order of different steps of the method, respectively.

(A) FIG. 2a illustrates a step of forming a buffer oxide film 30 to a thickness of about 250 Å on a P-type silicon substrate 2 by a thermal oxidation process. After that, a silicon nitride film 32 is deposited on the film 30 to a thickness of about 2500 to 3000 Å.

Figure 2B:
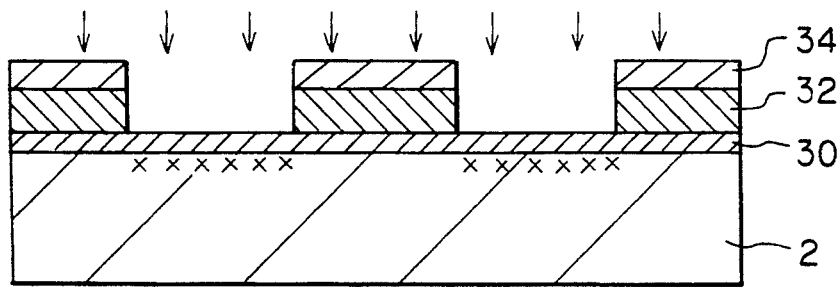

(B) FIG. 2b illustrates a step of coating the film 32 with a resist 34. The resist 34 is patterned by a photolithographic process to have openings in the portions for forming the source region and the drain region of the memory transistor.

After that, the film 32 is etched to form a pattern with the use of the resist pattern 34 as a mask.

After that, ions of phosphorus (P+) or arsenic (As+) are implanted into the substrate 2 through the buffer film 30. The implantation energy of the ions is more than 100KeV.

Figure 2C:
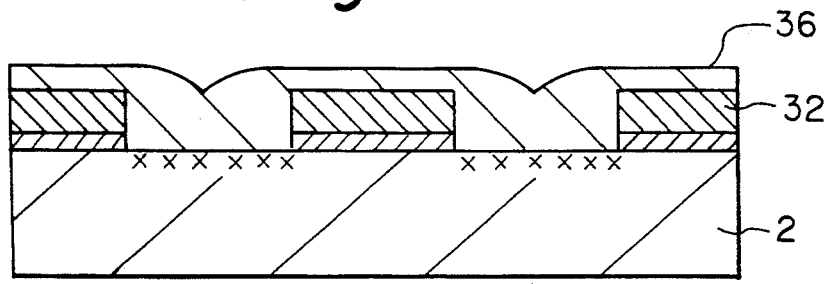

(C) FIG. 2c illustrates a step of removing the resist 34 and the buffer film 30 in the openings of the pattern of the silicon nitride film 32. After that, a refractory metal film 36 such as Ti (titanium) or W (tungsten) is deposited over the substrate 2 and the patterned film 32 by a sputtering process or a CVD process. The thickness of the film 36 is 500 to 10,000 Å. In this particular embodiment, the thickness is 600 Å.

Figure 2D:
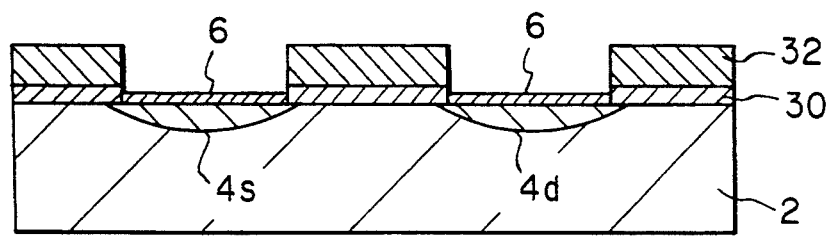

(D) FIG. 2d illustrates a step of thermal treatment of the layered structure for 15 to 20 minutes at a temperature of about 950° C. By this treatment, the impurities (ions) implanted into the substrate 2 are activated and form a source region 4s and a drain region 4d, respectively. At the same time, a silicide film 6 is formed in each opening as a result of reaction between the deposited refractory metal film 36 and the silicon substrate 2 in this thermal treatment.

After that, the unreacted film 36 is etched away remaining the silicide film 6 in each opening. The film 36 may be etched either by a wet etching process or a dry etching process, known per se.

Figure 2E:
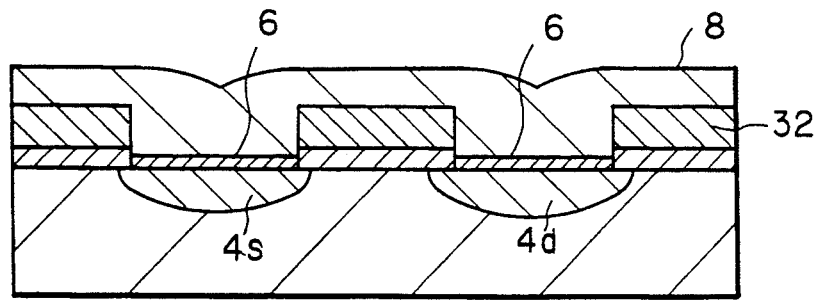

(E) FIG. 2e illustrates a step in which a silicon oxide film 8 such as PSG is deposited to a sufficient thickness to fill the openings of the film 32 by an appropriate method such as a CVD method. For example, the thickness of the film 8 is about 1 μm.

Figure 2F:
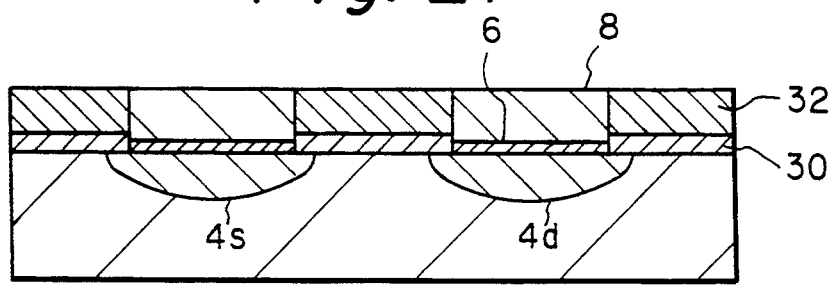

(F) FIG. 2f illustrates a step in which the film 8 is etched away from the surface of the film 32 by an etch back method to form a state that the openings of the film 32 are filled with the film 8. The etch back process may be conducted in such a way that the whole area is eched without applying any treatment of the surface of the film 8 after the deposition thereof. Or otherwise, it may be conducted in such a way that the whole area is etched after the surface of the film 8 is flattened by coating the surface with an insulation film such as SOG (Spin on Glass) under the condition that the etching speed of the film 8 is equal to that of the insulation film.

Figure 2G:
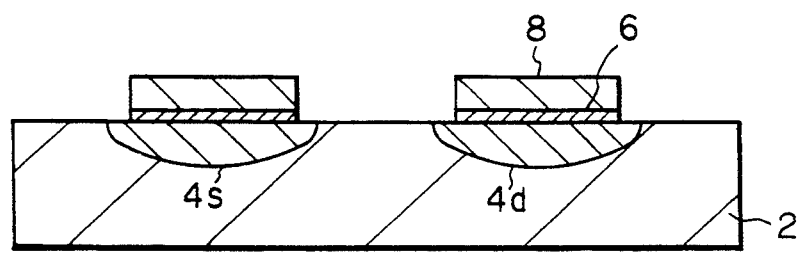

(G) FIG. 2g illustrates a step of removing the silicon nitride film 32 by etching. After the film 32 is etched away, the buffer film 30 deposited under the film 32 is removed by a silicon oxide etching process. In this process of etching the film 30, the silicon oxide film 8 deposited on the silicide film 6 is also etched by the same thickness as the film 30.

Figure 2H:
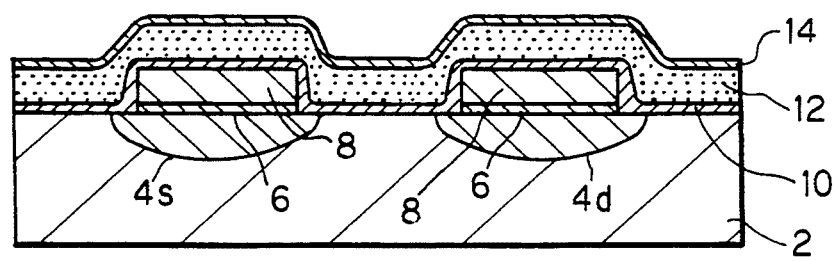

(H) FIG. 2h illustrates a step of forming a gate oxide film 10 to a thickness of 100 to 500 Å (200 Å in this particular embodiment) on the substrate 2 and the film 8. After that, a polysilicon film 12 is deposited on the film 10 to a thickness of 1000 to 5000 Å (2000 Å in this particular embodiment).

After that, a refractory metal such as Ti or W is deposited on the film 12 by a sputtering method or a CVD method. The refractory metal is heated to form a silicide film 14 on the film 12.

After that, the films 12 and 14 are patterned to form a word line (gate electrode) by a photolithographic process and an etching process.

After that, an insulation film for isolating the layers is formed, which is followed by forming processes of contact holes, metal wirings and a passivation film.

The core implantation process for determining the ROM code is carried out after the word lines are formed in the step (H), mentioned above.

The above mentioned embodiment of the invention is explained with regard to the N-channel MOS transistor. However, the invention is not limited to that type of transistor but can be applied to a P-channel MOS transistor as well.

Furthermore, in the memory device according to the present invention, polysilicon may be used for silicon substrate 2 in the step (A) mentioned above. In this case, the refractory metal film 36 deposited on the surfaces of the substrate 2 reacts with the polysilicon constituting the substrate 2 to thereby form polycide films 6, when subjected to the thermal treatment in the step (D).

As mentioned above, in accordance with the memory transistor having the planar cell structure according to the present invention, due to the arrangement of the silicide film formed on each of the source diffusion region and the drain diffusion region, the resistance of the bit lines made from the source region and the drain region can be lowered. For example, it becomes possible to reduce the resistance to about 1/10 or less of the structure in which the bit lines are made only from the diffusion regions without provision of the silicide films.

Also, the capacitance between the bit line and the word line is lowered since a thick insulation film is disposed therebetween.

Further, it becomes possible to avoid the increase of junction capacitance of the bit line since the core ions are hardly implanted into the bit lines due to the arrangement of the thick insulation film disposed between the word line and the bit line.

Therefore, it becomes possible to heighten the functional speed of the memory device of the planar cell structure.

It is to be noted that in the memory device according to the present invention, instead of the silicide film 6 disposed on each diffusion region, a refracrory material may be arranged without thermal treatment.

In that case, the memory device is produced in such a way that ions are implanted into the substrate and thereafter diffused therein by a thermal treatment of the substrate, after that the buffer oxide film 30 in the openings of the mask (silicon nitride film 32) is removed, and after that a refractory matal is deposited on the diffusion region exposed in each of the openings by an appropriate method. After that, a thick silicon oxide film 8 is formed on the refractory metal. After that, the gate oxide film 10 and the gate electrodes 12 are formed in the same way as described with reference to FIGS. 2g and 2h. On each of the electrodes 12 may be deposited a refractory metal instead of the silicide film 14.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for producing a semiconductor memory device comprising steps of:
    forming a buffer layer on a substrate;
    forming a mask layer on said buffer layer, said mask layer having openings corresponding to patterns of diffusion regions;
    implanting impurities into said substrate through said mask layer and said buffer layer;
    forming diffusion regions in said substrate by diffusing said implanted impurities therein by a thermal treatment of said substrate;
    removing said buffer layer disposed in each of said openings of said mask layer;
    forming a refractory metal film on said diffusion region in each of said openings after removing said buffer layer from said diffusion region;
    forming an electric insulation film on said refractory metal film formed in each of said openings;
    removing said mask layer and said buffer layer disposed under said mask layer from said substrate while remaining said refractory metal film and said insulation film which are stacked on said diffusion region;
    forming a gate oxide film so as to cover said substrate, said refractory metal film and said insulation film formed on said refractory metal film; and
    forming gate electrodes on said gate oxide film.

2. A method for producing a semiconductor memory device according to claim 1, wherein said substrate is made of silicon, and said buffer layer is formed by thermal oxidation of said substrate.

3. A method for producing a semiconductor memory device according to claim 2, wherein said mask layer is made of silicon nitride.

4. A method for producing a semiconductor memory device according to claim 3, wherein said insulation film formed on said refractory metal film is made of silicon oxide and said gate electrodes are made of polysilicon.

5. A method for producing a semiconductor memory device according to claim 1, wherein said diffusion regions comprise a first diffusion region composed of at least one source region commonly used for a plurality of memory transistors, and a second diffusion region composed of at least one drain region commonly used for the plurality of memory transistors.

6. A method for producing a semiconductor memory device comprising steps of:
    forming a buffer layer on a substrate;
    forming a mask layer on said buffer layer, said mask layer having openings corresponding to patterns of diffusion regions;
    implanting impurities into said substrate through said mask layer and said buffer layer;
    removing said buffer layer disposed in each of said openings of said mask layer;
    forming a refractory metal film in each of said openings after removing said buffer layer therefrom;
    conducting a thermal treatment to said substrate and said formed refractory metal film to thereby diffuse said implanted impurities in said substrate to form diffusion regions and simultaneously form a silicide film from said refractory metal in a portion which is in contact with said substrate;

removing said refractory metal film while remaining said silicide film in each of said openings;

forming an electric insulation film on said silicide film formed in each of said openings;

removing said mask layer and said buffer layer disposed under said mask layer from said substrate while remaining said silicide film and said insulation film stacked on said diffusion region;

forming a gate oxide film so as to cover said substrate, said refractory metal film and said insulation film formed on said refractory metal film; and forming gate electrodes on said gate oxide film.

7. A method for producing a semiconductor memory device according to claim 6, wherein said substrate is made of silicon, and said buffer layer is formed by thermal oxidation of said substrate.

8. A method for producing a semiconductor memory device according to claim 7, wherein said mask layer is made of silicon nitride.

9. A method for producing a semiconductor memory device according to claim 8, wherein said insulation film formed on said silicide film is made from silicon oxide, and said gate electrodes are made of polysilicon.

10. A method for producing a semiconductor memory device according to claim 6, wherein said diffusion regions comprise a first diffusion region composed of at least one source region commonly used for a plurality of memory transistors, and a second diffusion region composed of at least one drain region commonly used for the plurality of memory transistors.

11. A method for producing a semiconductor memory device comprising the steps of:

thermally oxidizing a silicon substrate to thereby form a buffer oxide film on one of surfaces of said silicon substrate;

forming a mask layer of silicon nitride on said formed buffer oxide film, said mask layer having opening portions which correspond to patterns of diffusion regions;

implanting impurities into said substrate through buffer oxide films which are exposed in said opening portions;

removing said exposed buffer oxide films to thereby expose portions of said substrate corresponding to said opening portions;

depositing a refractory metal film on exposed portions of said substrate and said mask layer;

subjecting the substrate provided with said refractory metal film to a thermal treatment, thereby changing said deposited refractory metal film on said exposed portions of the substrate into silicide films and diffusing said implanted impurities to form diffusion regions in said substrate;

removing the refractory metal film remaining on the mask layer;

depositing an electric insulation film on said silicide films and said mask layer such that each of said opening portions is filled with said insulation film;

removing portion of said insulation film disposed on said mask layer, said mask layer and said buffer oxide film disposed between said insulation film and said substrate by an etching process, thereby leaving said silicide films and said insulation films deposited on said silicide films;

forming a gate oxide film on insulation films remaining on said silicide films and an exposed surface of said substrate;

depositing a polysilicon film on said formed gate oxide film;

depositing a refractory metal film on said deposited polysilicon film;

subjecting said deposited refractory metal film to a thermal treatment to thereby change said deposited refractory metal film into another silicide film; and patterning said another silicide film and said deposited polysilicon film by a photolithographic process and an etching process thereby forming gate electrodes.

12. A method for producing a semiconductor memory device according to claim 11, in which said refractory metal film is converted into polycide films in the step of subjecting the substrate provided with the refractory metal film to the thermal treatment.

13. A method for producing a semiconductor memory device according to claim 12, in which said insulation film comprises silicon oxide.

14. A method for producing a semiconductor memory device according to claim 13, in which said diffusion regions comprise a first diffusion region composed of at least one source region commonly used for a plurality of memory transistors and a second diffusion region composed of at least one drain region commonly used for the plurality of memory transistors.

15. A method for producing a semiconductor memory device according to claim 14, in which said gate oxide film is formed so as to have a thickness which is less than that of said insulation film.

16. A method for producing a semiconductor memory device according to claim 15, in which said step of depositing said polysilicon film comprises a step of implanting core ions into regions of said substrate in which memory transistors are formed.

17. A method for producing a semiconductor memory device comprising the steps of:

thermally oxidizing a silicon substrate to thereby form a buffer oxide film on one of surfaces of said silicon substrate;

forming a mask layer of silicon nitride on said formed buffer oxide film, said mask layer having opening portions which correspond to patterns of diffusion regions;

implanting impurities into said substrate through buffer oxide films which are exposed in said opening portions;

subjecting the substrate implanted with said impurities to a thermal treatment, thereby diffusing said implanted impurities to form diffusion regions in said substrate;

removing said exposed buffer oxide films to thereby expose portions of said substrate corresponding to said opening portions;

depositing refractory metal films on exposed portions of said substrate;

depositing an electric insulation film on said deposited refractory metal film and said mask layer such that each of said opening portions is filled with said insulation film;

removing a portion of said insulation film disposed on said mask layer, said mask layer and said buffer oxide film disposed between said insulation film and said substrate by an etching process, thereby leaving said refractory metal film and said insulation films disposed on said refractory metal film;

forming a gate oxide film on insulation films remaining on said refractory metal films and an exposed surface of said substrate;

depositing a polysilicon film on said formed gate oxide film;

depositing another refractory metal film on said deposited polysilicon film; and patterning said another refractory metal film and said deposited polysilicon film by a photolithographic process and an etching process thereby forming gate electrodes.

18. A method for producing a semiconductor memory device according to claim 17, in which said insulation film comprises silicon oxide.

19. A method for producing a semiconductor memory device according to claim 18, in which said diffusion regions comprise a first diffusion region composed of at least one source region commonly used for a plurality of memory transistors and a second diffusion region composed of at least one drain region commonly used for the plurality of memory transistors.

20. A method for producing a semiconductor memory device according to claim 19, in which said gate oxide film is formed so as to have a thickness which is less than that of said insulation film.

21. A method for producing a semiconductor memory device according to claim 20, in which said step of depositing said polysilicon film comprises a step of implanting core ions into regions of said substrate in which memory transistors are formed.

* * * * *